United States Patent
Nagahashi (10) Patent No.: US 7,288,005 B2
(45) Date of Patent: Oct. 30, 2007

(54) SEMICONDUCTOR DEVICE HAVING A MODULE BOARD

(75) Inventor: Haruki Nagahashi, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 11/432,334

(22) Filed: May 12, 2006

(65) Prior Publication Data
US 2006/0264112 A1    Nov. 23, 2006

(30) Foreign Application Priority Data
May 17, 2005    (JP) .............................. 2005-144128

(51) Int. Cl.
*H01R 24/00*    (2006.01)

(52) U.S. Cl. ...................................... 439/637; 439/260

(58) Field of Classification Search ................ 174/267; 439/637, 260, 629; 361/791, 784, 774
See application file for complete search history.

(56) References Cited

U.S. PATENT DOCUMENTS

| | | | | |
|---|---|---|---|---|
| 2,711,523 A * | 6/1955 | Willis | .......................... | 439/260 |
| 3,340,440 A * | 9/1967 | Minter | .......................... | 439/82 |
| 3,624,587 A * | 11/1971 | Conrad | .......................... | 439/65 |
| 4,575,167 A * | 3/1986 | Minter | .......................... | 439/83 |
| 6,017,246 A * | 1/2000 | Hisazumi et al. | ........... | 439/637 |
| 6,246,016 B1 * | 6/2001 | Roessler et al. | ............ | 361/784 |
| 6,629,855 B1 * | 10/2003 | North et al. | ................ | 439/325 |

FOREIGN PATENT DOCUMENTS

| | | |
|---|---|---|
| JP | 10-335546 | 12/1998 |
| JP | 2004-079940 | 3/2004 |

* cited by examiner

*Primary Examiner*—Briggitte R. Hammond
(74) *Attorney, Agent, or Firm*—Young & Thompson (57) ABSTRACT

A mother board mounts a memory module via a plug-socket coupling, wherein the edge of the memory module has a plug member mounted on a socket member of the mother board. The mother board has a plurality of abutment members abutting the edge surface of the bottom edge of the memory module for which the plug is formed. The abutment members act as ground terminals for connecting the ground layer of the memory module to the ground layer of the mother board, and also act as heat radiation members.

9 Claims, 7 Drawing Sheets

SEMICONDUCTOR DEVICE HAVING A MODULE BOARD

BACKGROUND OF THE INVENTION (a) Field of the Invention

The present invention relates to a semiconductor device having a module board and, more particularly, to a semiconductor device having a module board mounting thereon a plurality of electric components and mounted on a mother board.

(b) Description of the Related Art

In conventional personal computers or servers, memory devices such as DRAM devices are directly mounted on a mother board. However, memory module boards are increasingly employed recently, wherein a printed circuit board mounting thereon one or a plurality of memory devices is separately prepared, and then mounted on a mother board via a plug-socket coupling.

Figure 9:
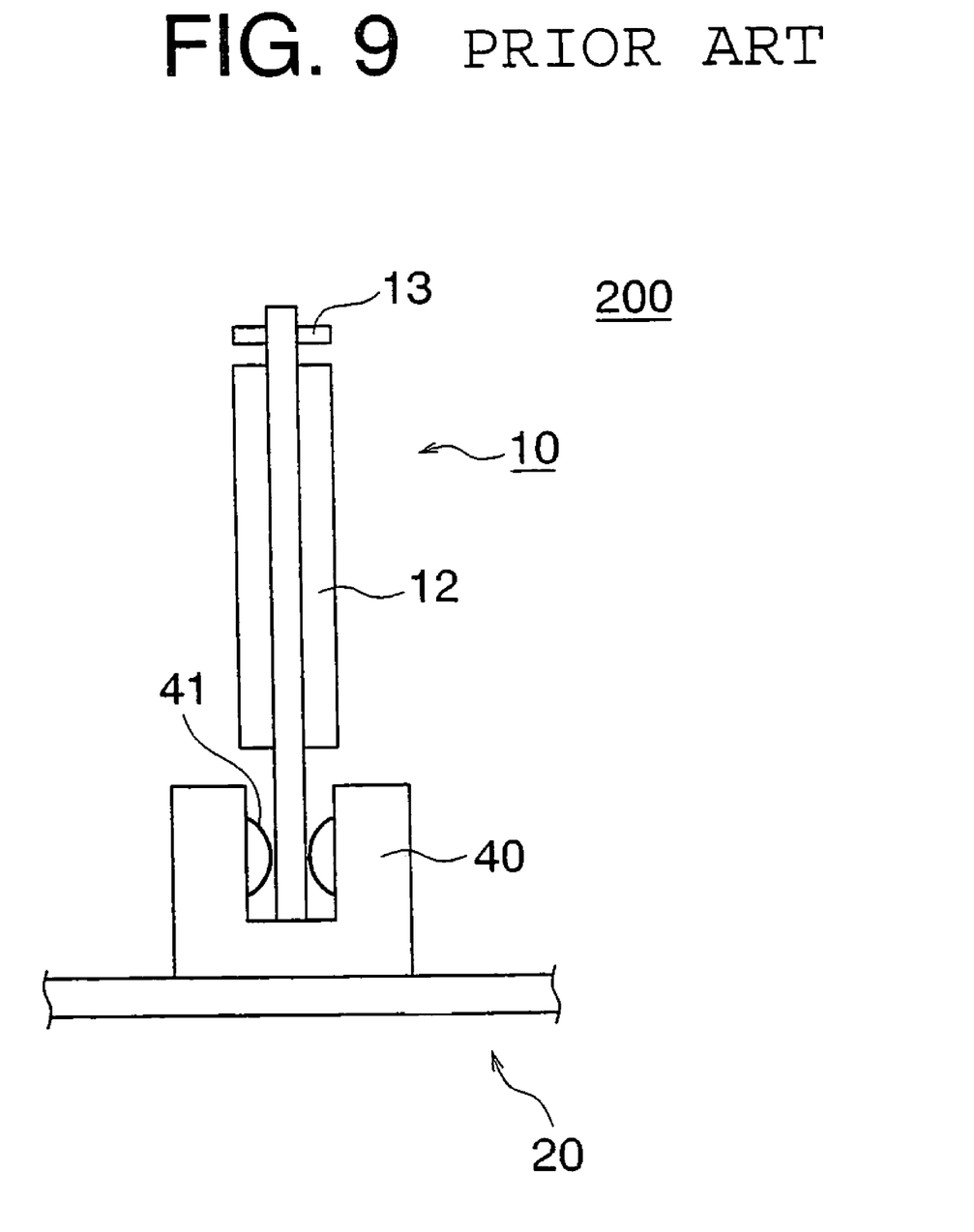
FIG. 9 is a sectional view of a conventional semiconductor device.

FIG. 9 shows a conventional semiconductor device having such a memory module board. The semiconductor device 200 includes a mother board 20 having a socket member 40 of a U-shaped cross section, and a memory module board 10 having a plug member and mounted on the mother board 20 by using the plug-socket coupling. The socket member 40 includes a plurality of contact terminals 41 arranged in two rows corresponding to pad terminals provided on both surfaces of the memory module board 10, whereby the memory module board 10 is detachably mounted on the mother board 20.

In the memory module board 10, the amount of heat generated in the memory devices 12 is more and more increasing along with a higher read/write operation and a higher density of memory cells in the memory devices 12. The increased amount of heat raises the operating temperature within the memory devices 12 and sometimes causes a degradation of the performance or thermal destruction of the memory cells. For preventing such degradation of the performance or destruction of the memory cells, it is essential to effectively diffuse the heat generated in the memory cells and suppress the temperature rise of the memory cells.

Patent Publications JP-10(1998)-335546A and -2004-079940A describe a technique wherein a heat radiation member is provided on the memory module board to diffuse the heat through the surface of the memory module board.

A higher read/write operation and an increased density of the memory cells in the up-to-date memory module boards hinder the effective suppression of temperature rise of the memory devices in the memory module boards, even in the case of the memory module boards described in the above publications. Thus, it is desired to effectively diffuse the heat generated in the memory cells, to assure the stable performance of the semiconductor devices including the memory cells.

SUMMARY OF THE INVENTION

In view of the above problem in the conventional technique, it is an object of the present invention to provide a semiconductor device including a module board mounting thereon one or a plurality of electric components, and a mother board mounting thereon the module board and capable of suppressing the temperature rise of the electric components in the module board.

The present invention provides a semiconductor device including: a module board having a plurality of pad terminals on both surfaces of a first edge thereof, the pad terminals configuring a plug member; and a mother board having a plurality of contact terminals arranged in two rows, the contact terminals configuring a socket member for connecting to the plug member by sandwiching the first edge between the two rows of the contact terminals, wherein the mother board has an abutment member disposed between the two rows of the contact terminals for abutting an edge surface of the first edge.

In accordance with the semiconductor device of the present invention, the abutment member abutting the edge surface of the first edge of the module board mechanically supports the module board, and at the same time, effectively diffuses the heat generated in the module board toward the mother board. Thus, the temperature rise of the module board can be suppressed to maintain the performance of the electric components mounted on the module board.

It is preferable in the present invention that the abutment member have a higher coefficient of heat conductivity, and may preferably have a coefficient of 1 W/(m·K) or more for the heat conductivity.

The abutment member may be made of a conductive material acting as a ground terminal or a power source terminal for coupling together the ground layers or power source layers of both the module board and mother board. In an alternative, the abutment member may be made of a plastic material having a higher coefficient of heat conductivity. The abutment member may be made of an elastic material for urging the edge surface away from the mother board and thereby achieving a stable abutment of the abutment member against the edge surface.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings, wherein similar constituent elements are designated by similar reference numerals throughout the drawings.

Figure 1:
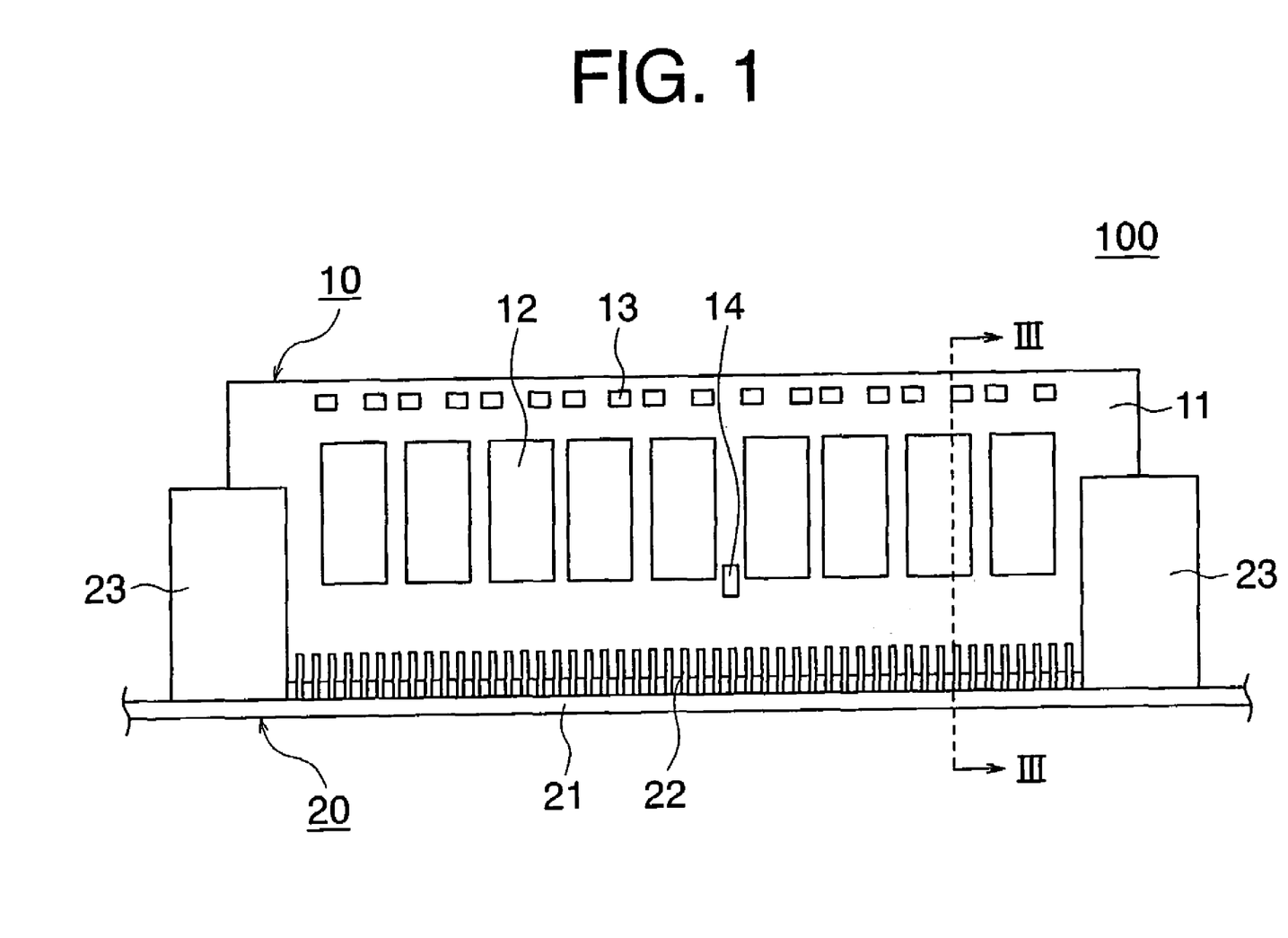
FIG. 1 is a front view of a semiconductor device according to a first embodiment of the present invention.
Figure 2:
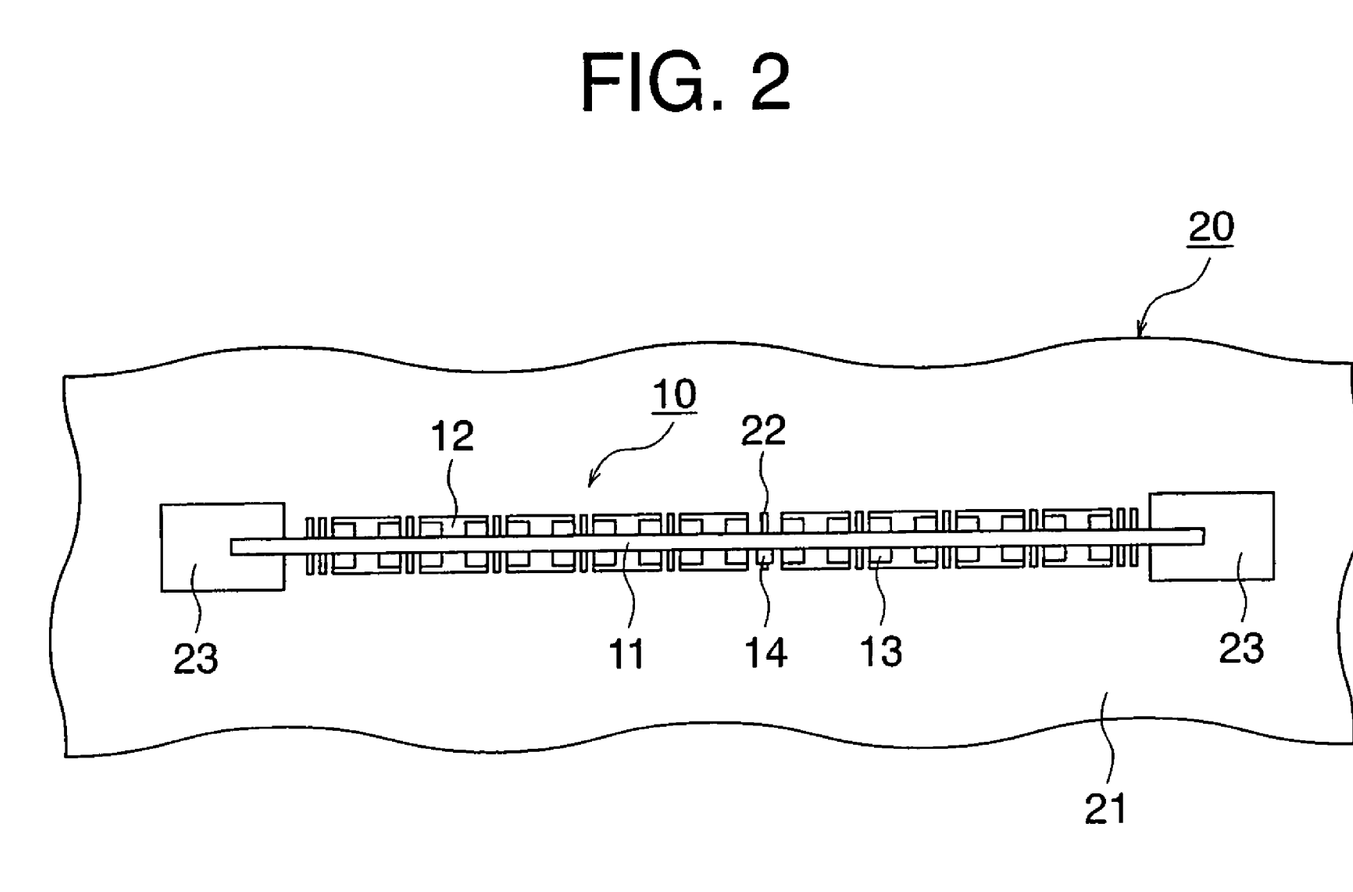
FIG. 2 is a top plan view of the semiconductor device of FIG. 1.

FIG. 1 illustrates a front view of a semiconductor device according to a first embodiment of the present invention, and FIG. 2 is a top plan view of the semiconductor device of FIG. 1. The semiconductor device, generally designated by numeral 100, includes a memory module board 10, and a mother board 20 mounting the memory module board 10 at the bottom edge thereof on the surface of the mother board 20.

The memory module board 10 includes a board body 11 wherein a plurality of insulation layers and a plurality of patterned conductive layers are alternately layered one on another, and a plurality of electronic components, such as DRAM devices 12, bypass condensers 13 and an EEPROM 14, which are provided on both front and rear surfaces of the board body 11. The patterned conductive layers include signal layers, power source layers and ground layers. The EEPROM 14 configures a SPD (serial presence detect) device, which stores therein information of specifications of the memory module 10. The bottom edge of the memory module 10 is provided with a plurality of pad terminals (not shown) on both front and rear surfaces of the board body 11 for configuring a plug member.

The mother board 20 is configured by a printed circuit board including a board body 21, wherein a plurality of insulation layers and a plurality of patterned conductive layers are alternately layered one on another, similarly to the board body 11 of the memory module 10. The mother board 20 is provided with a plurality of contact terminals 22, which protrude from the top surface of the board body 21 for configuring a socket member, which mounts thereon the plug member of the memory module 10. The mother board 20 has thereon a pair of board latches 23 for fixing the board body 11 of the module board 10 in the vicinity of both the side edges thereof.

Figure 3:
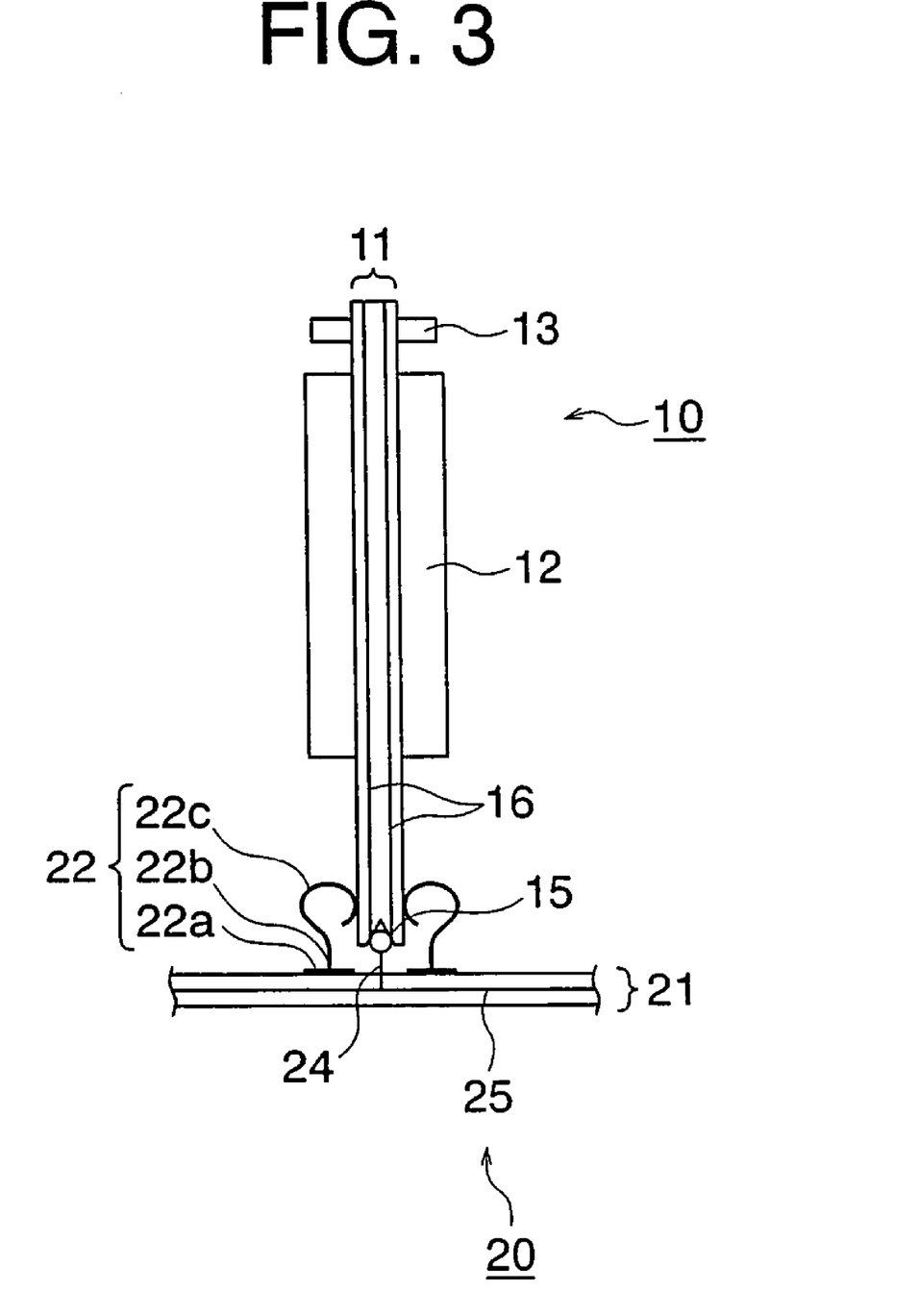
FIG. 3 is a sectional view taken along line III-III in FIG. 1.

Referring to FIG. 3 taken along line III-III in FIG. 1, the contact terminals 22 each include a base portion 22a fixed onto the board body 21 of the mother board 20, a support portion 22b extending upright from the base portion 22a, and a contact portion 22c in contact with a corresponding pad terminal of the memory module 10. The contact portion 22c is of a substantially circular shape extending from the support portion 22b and has a spring function to abut the pad terminal of the memory module 10 in the horizontal direction. The contact terminals 22 electrically connect the pad terminals of the memory module 10 to the patterned conductive layers of the mother board 20, and also assist the fixing of the memory module 10 onto the mother board 20.

The bottom edge surface of the board body 11 of the memory module 10 has thereon a V-shaped groove 15 extending along the bottom edge. The groove 15 is about 1 mm deep, and exposes therethrough an edge of the ground layers 16 of the memory module 10. The ground layers 16 extend substantially over the entire area of the memory module 10, have an area larger than the area of the signal layers and the power source layers, and thus have a larger heat capacity than the signal layers and the power source layers.

The mother board 20 has a plurality of ground terminals (or abutment members) 24 arranged in the extending direction of the groove 15 of the memory module 10, between two rows of the contact terminals 22. The ground terminals 24 have a linear portion fixed onto the mother board 20, and a circular portion fixed on the top of the linear portion. The linear portion of the ground terminals 24 extends from one of the ground layers 25 of the mother board 20 and penetrates one or more of the insulation layers of the mother board 20 toward the memory module board 10.

After the module board 10 is mounted on the mother board 20, the ground terminals 14 abut the groove 15 to be in contact with the ground layers 16 exposed on the bottom surface of the groove 15. Thus, the ground layers 16 of the memory module 10 are electrically connected to the ground layer 25 of the mother board 20.

Figure 4A:
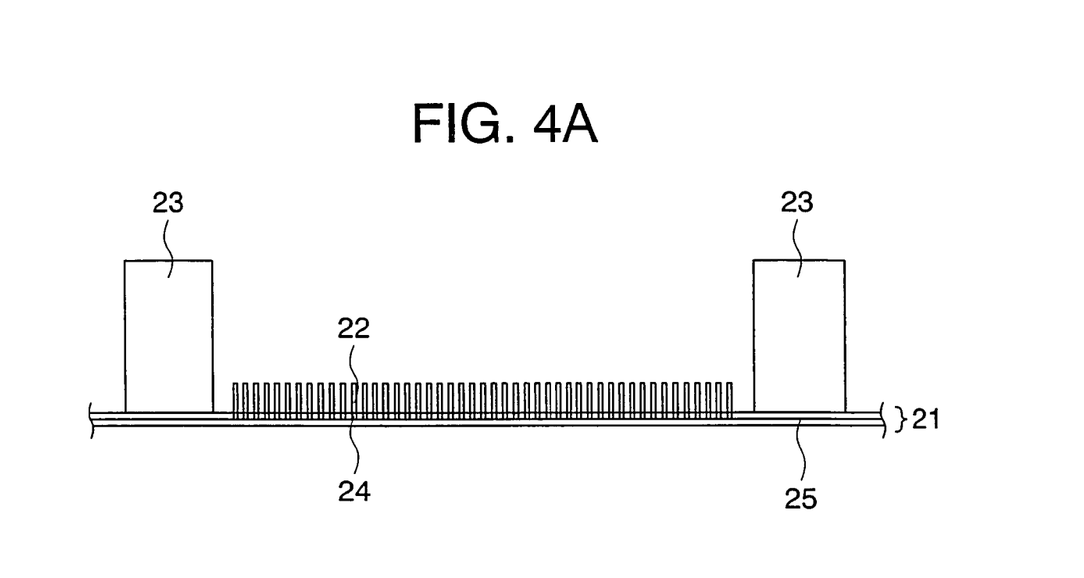
FIG. 4A is a side view of the mother board of FIG. 1 shown separately from the module board.
Figure 4B:
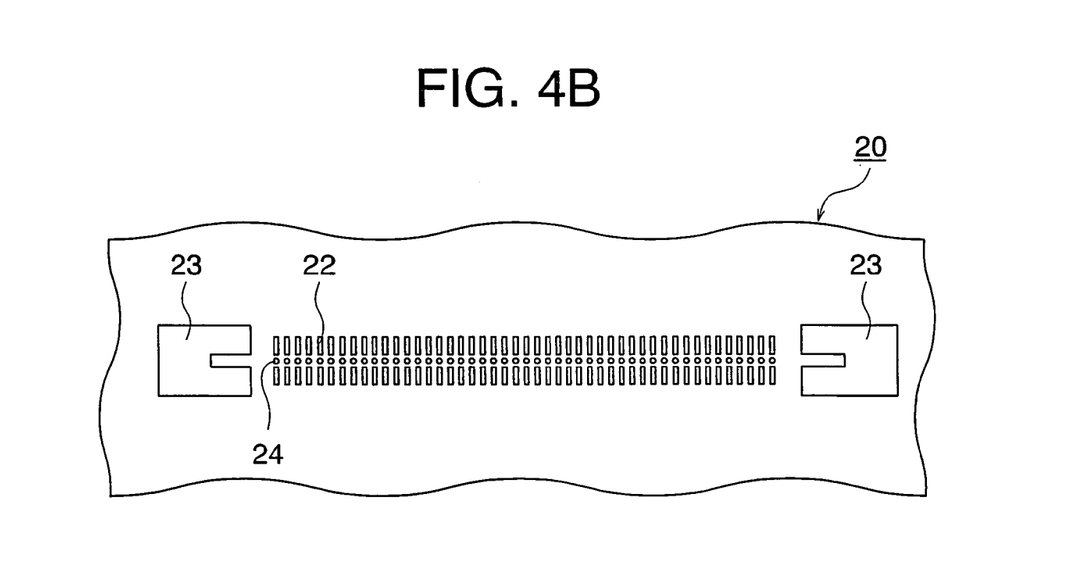
FIG. 4B is a top plan view of the mother board of FIG. 4A.

FIGS. 4A and 4B show a side view and a top plan view, respectively, of the mother board 20. In FIG. 4A, the ground terminals 24 are illustrated to extend from a ground layer 25 of the mother board 20. The ground terminals 24 are made of iron, for example, and have a coefficient of around 84 W/(m·K) for the heat conductivity.

In general, the heat generated in the memory devices 12 on the memory module 10 is diffused from the memory devices 12 via the heat radiation and the heat convection from the chip surface of the memory devices 12 toward the ambient atmosphere in an amount of 70% of the total heat, and the remaining amount of heat is diffused from the memory devices 12 toward the board body 11 of the memory module 10 via the heat conductivity. In the conventional memory module, since the coefficient of the heat conductivity is not large in the memory module, the heat generated in the memory devices 12 cannot be efficiently diffused toward the mother board 20.

On the other hand, in the semiconductor device 100 of the present embodiment, the ground layer 25 of the mother board 20 having a higher heat capacity and a higher heat conductivity is in contact with the groove 15 of the memory module 10 via the ground terminals 24, the groove 15 exposing therethrough the ground layer 16 of the memory module 10 having a higher heat conductivity. Thus, the heat generated in the memory devices 12 in the memory module 10 can be efficiently diffused from the memory module 10 toward the mother board 20, thereby suppressing a temperature rise of the memory devices 12.

In addition, exposure of the contact terminals 22 and pad terminals to the ambient atmosphere by removing a socket housing from these terminals effectively diffuses the heat toward the ambient atmosphere. Thus, the temperature rise of the memory devices 12 can be further suppressed.

In the semiconductor device 100 of the present embodiment, the ground terminals 24 received in the groove 15 assists fixing of the memory module 10 in the thickness direction thereof with respect to the mother board 20.

Figure 5:
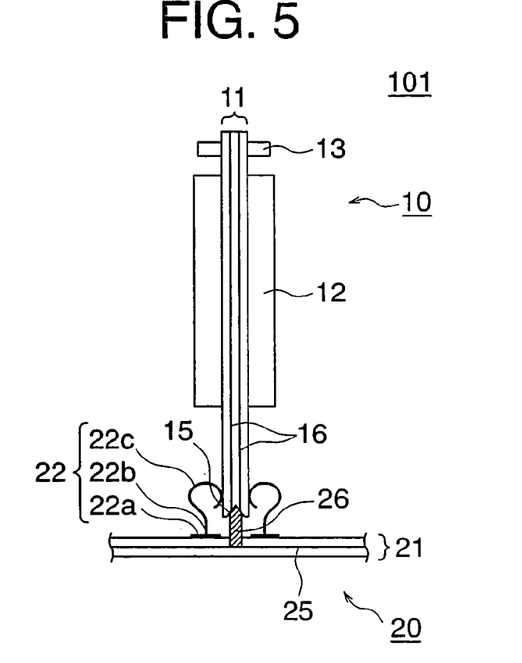
FIG. 5 is a sectional view of a semiconductor device according to a second embodiment of the present invention.

FIG. 5 shows a semiconductor device according to a second embodiment of the present invention. The semiconductor device 101 of the present embodiment is similar to the first embodiment except for the configuration of the ground terminal 26 of the mother board 10 in the present embodiment. More specifically, the ground terminal 26 in the present embodiment is configured as a plate member made of ion, for example. The ground terminal 26 in the present embodiment has a sharp top edge adapted to the bottom surface of the V-shaped groove 15. The ground terminal 26 is connected to the ground layer 25 of the mother board 20.

After the memory module 10 is mounted on the mother board 10 via the plug-socket coupling, the sharp top edge of the ground terminal 26 abuts the groove 15 and the edge of the ground layer 16 in the memory module 10, whereby the heat generated in the memory devices 12 can be effectively diffused via the ground terminal 26 toward the mother board 20. In addition, the mechanical strength for coupling the memory module 10 to the mother board 20 is also improved in the thickness direction of the memory module 10.

Figure 6:
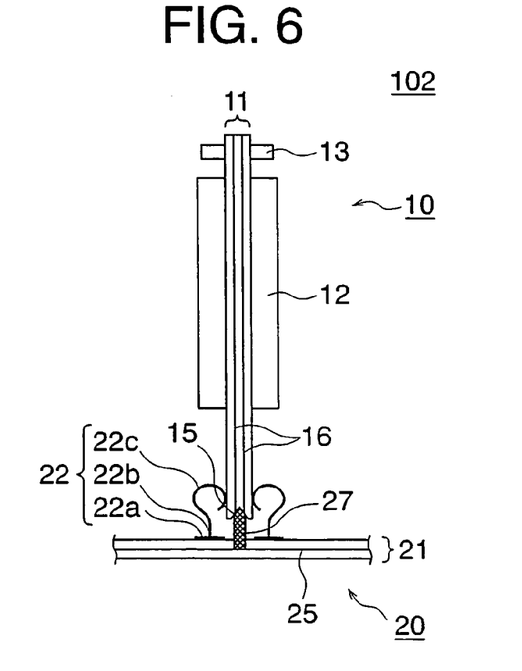
FIG. 6 is a sectional view of a semiconductor device according to a third embodiment of the present invention.

FIG. 6 shows a semiconductor device according to a third embodiment of the present invention. The semiconductor device 102 of the present embodiment is similar to the second embodiment except that the material of the ground terminal 26 in the second embodiment is replaced by an insulation member 27 in the present embodiment. More specifically, the insulation member 27 of the mother board 20 is made of a plastic material having a higher coefficient of heat conductivity compared to the ordinary plastic materials. The insulation member 27 in the present embodiment is made of NT-787 (Trade Mark) supplied from Idemitsu Oil & Co. LTD. and having a coefficient of 20 W/(m·K) for the heat conductivity. The contact terminals 22 include ground terminals in the present embodiment.

Figure 7:
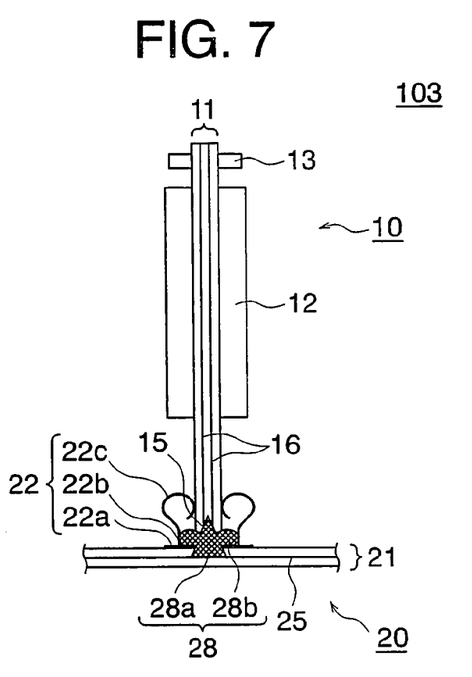
FIG. 7 is a sectional view of a semiconductor device according to a fourth embodiment of the present invention.

FIG. 7 shows a semiconductor device according to a fourth embodiment of the present invention. The semiconductor device 103 of the present embodiment is similar to the third embodiment except for the sectional shape of the insulation member 28 in the present embodiment. More specifically, the insulation member 28 in the present embodiment has a central portion 28a having a triangular sectional shape and a pair of side attachments 28b protruding from both sides of the triangular central portion 28a. The central portion 28a abuts the V-shaped groove 15 at the top of the central portion 28a, whereas the side attachments 28b abuts the support portion 22b of the contact terminals 22. The insulation member may be divided into a plurality of pieces in the extending direction of the groove 15.

In the semiconductor device 103 of the present embodiment, side attachments 28b of the insulation member 28 diffuses the heat of the memory module 10 via the bottom edge of the ground layer 18 of the memory module 10 toward the contact terminals 22. The central portion 28a assists fixing of the memory module 10 onto the mother board 20 and at the same time diffuses the heat from the memory module 10 toward the ground layer 26 of the mother board 20.

The central portion 28a of the insulation member 28 abuts the V-shaped groove 15 and the edge of the ground layer 16 of the memory module 10 at the top of the insulation member 28, and also abuts the ground layer 25 of the mother board 20 at the bottom of the insulation member 28. This configuration of the insulation member 28 allows the insulation member to effectively diffuse the heat from the memory module board 10 toward the mother board 20, and at the same time, assist fixing of the memory module member 10 in the thickness direction thereof.

Figure 8:
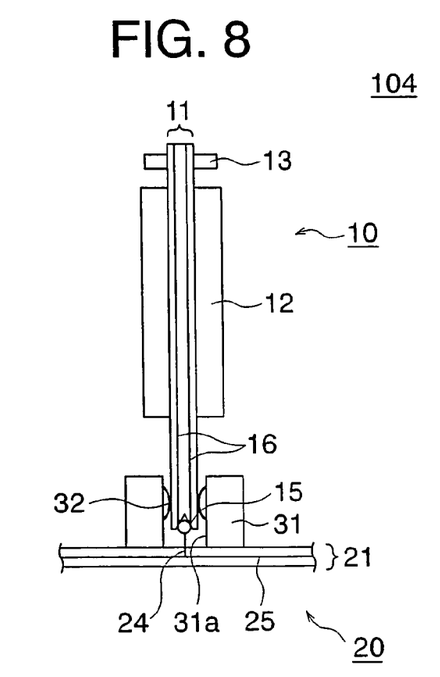
FIG. 8 is a sectional view of a semiconductor device according to a fifth embodiment of the present invention.

FIG. 8 shows a semiconductor device according to a fifth embodiment of the present invention. The semiconductor device 104 of the present embodiment is similar to the first embodiment except for the presence of a pair of socket housings 30 for mounting thereon the memory module 10. More specifically, the pair of socket housings 31 support therebetween the memory module 10 via contact terminals 32 fixed onto the socket housings 31.

The contact terminals 32 in the present embodiment are of a circular arc, and have a spring function to abut the pad terminals of the memory module 10.

It is to be noted, for example, that the V-shaped groove 15 in the above embodiments may be replaced by a groove having different cross-sectional shape. In addition, the abutment member may be signal terminals or power source terminals instead of the ground terminals shown in the above embodiments.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
a module board having a plurality of pad terminals on both surfaces of a first edge thereof, said pad terminals configuring a plug member; and
a mother board having a plurality of contact terminals arranged in two rows, said contact terminals configuring a socket member for connecting to said plug member by sandwiching said first edge between said two rows of said contact terminals,
wherein said mother board has an abutment member disposed between said two rows of said contact terminals for abutting an edge surface of said first edge,
wherein said abutment member is made of a conductive material,
wherein said edge surface exposes therethrough an edge of a ground layer of said module board, and said abutment member is connected to a ground layer of said mother board.

2. A semiconductor device comprising:
a module board having a plurality of pad terminals on both surfaces of a first edge thereof, said pad terminals configuring a plug member; and
a mother board having a plurality of contact terminals arranged in two rows, said contact terminals configuring a socket member for connecting to said plug member by sandwiching said first edge between said two rows of said contact terminals,
wherein said mother board has an abutment member disposed between said two rows of said contact terminals for abutting an edge surface of said first edge,
wherein said abutment member is made of a conductive material,
wherein said edge surface exposes an edge of a power source layer of said module board, and said abutment member is connected to a power source layer of said mother board.

3. A semiconductor device comprising:
a module board having a plurality of pad terminals on both surfaces of a first edge thereof, said pad terminals configuring a plug member; and
a mother board having a plurality of contact terminals arranged in two rows, said contact terminals configuring a socket member for connecting to said plug member by sandwiching said first edge between said two rows of said contact terminals,
wherein said mother board has an abutment member disposed between said two rows of said contact terminals for abutting an edge surface of said first edge,
wherein said mother board has a plurality of said abutment member each corresponding to one or more of said pad terminals.

4. A semiconductor device comprising:
a module board having a plurality of pad terminals on both surfaces of a first edge thereof, said pad terminals configuring a plug member; and
a mother board having a plurality of contact terminals arranged in two rows, said contact terminals configuring a socket member for connecting to said plug member by sandwiching said first edge between said two rows of said contact terminals, wherein,
said module board has a groove extending on and along a bottom surface of said first edge, and
said mother board has at least one abutment member disposed between said two rows of said contact terminals for abutting said groove along said bottom surface of said first edge.

5. The semiconductor device according to claim 1, wherein said abutment member is made of a conductive material.

6. The semiconductor device according to claim 1, wherein said contact terminals each have an inner surface abutting said pad terminals and an outer surface exposed to an ambient atmosphere.

7. The semiconductor device according to claim 1, wherein said abutment member extends along said edge surface of said first edge.

8. The semiconductor device according to claim 1, wherein said abutment member is made of an elastic material and urges said edge surface of said first edge away from said mother board.

9. The semiconductor device according to claim 1, wherein said module board mounts thereon at least one memory device.

* * * * *